April 7, 1964 J. W. BURKIG ETAL 3,128,332

ELECTRICAL INTERCONNECTION GRID AND METHOD OF MAKING SAME

Filed March 30, 1960 3 Sheets-Sheet 1

Jack W. Burkig,
John E. Richardson,
*INVENTORS.*

*BY*

[signature]

*ATTORNEY.*

Jack W. Burkig,
John E. Richardson,
INVENTORS.
BY.
Edwin A. Oser.
ATTORNEY.

ELECTRICAL INTERCONNECTION GRID AND METHOD OF MAKING SAME

Jack W. Burkig,
John E. Richardson,
*INVENTORS.*
*BY.*
[signature]
*ATTORNEY.*

3,128,332
ELECTRICAL INTERCONNECTION GRID AND METHOD OF MAKING SAME

Jack W. Burkig, Santa Monica, and John E. Richardson, Los Angeles, Calif., assignors to Hughes Aircraft Company, Culver City, Calif., a corporation of Delaware
Filed Mar. 30, 1960, Ser. No. 18,759
6 Claims. (Cl. 174—68.5)

This invention relates to means for interconnecting electrical circuits and more particularly to interconnection of electrical circuitry and to a method of manufacture thereof.

A major problem in the manufacture of highly miniaturized electronic circuitry, also called micro-miniaturized circuitry, has been the interconnection of the various elements or subcircuits comprising the circuits. Because of the extremely small size of the components and the even smaller size of the electrical leads used with such components, the use of conventional wiring techniques is so inefficient as to be completely impractical.

Many techniques for printing, etching or depositing electrical interconnections are in general use. However, these techniques and the devices made by their use suffer disadvantages. In general, such devices have been very costly and difficult to manufacture. Also, the extremely small size required for use with micro-miniaturized circuits has generally not been attained. Still another factor relating to the high cost of prior art devices has been that each circuit configuration desired requires a radically different technique of manufacture.

It is therefore an object of the present invention to provide a novel grid for interconnecting components or circuits of extremely small size compatible with micro-miniaturized components.

Another object of this invention is to provide an interconnection grid of relatively simple and inexpensive manufacture.

A further object of this invention is to provide a method of manufacture of an interconnection grid adapted to provide efficient mass production of the grid.

Still another object of this invention is to provide a method of manufacture of an interconnection grid which utilizes the same steps save the last, regardless of the specific circuit configuration being manufactured.

In accordance with the present invention, an electrical interconnection grid of a size compatible with that of micro-miniaturized components is provided. The grid comprises a plurality of horizontal conducting lines or conductors and a superimposed plurality of vertical conducting lines, suitably insulated from the horizontal lines. Connections may be made between any desired horizontal and vertical conducting lines. Also, the electrical continuity of any of the lines may be interrupted at any desired point.

A novel tab structure is provided which enables the manufacture of a uniform interconnection grid having each horizontal line electrically connected to each vertical line, regardless of circuit configuration. The connections necessary for a particular circuit configuration are made by an additional manufacturing step performed on the completed grid structure. By the use of the additional step, horizontal-to-vertical connections may be interrupted and further breaks in the electrical continuity of either the horizontal or vertical conducting lines may be made at any desired point. This tab structure yields the advantage that through all of the procedural steps save the last, no variations due to the particular circuit configuration being interconnected are necessary.

Other objects and advantages of the present invention will become apparent to those skilled in the art by reference to the accompanying specification and drawings, in which.

Figure 1:
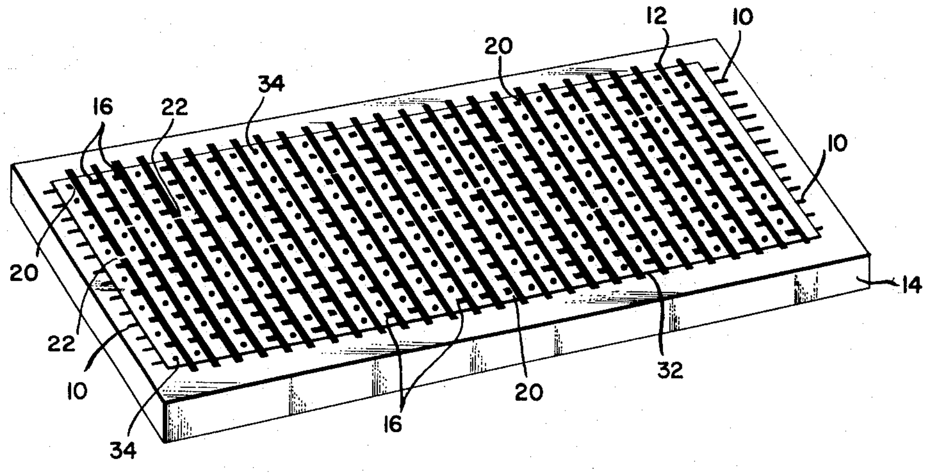
FIG. 1 is a partially schematic distorted perspective view of aparatus embodying the invention.
Figure 2:
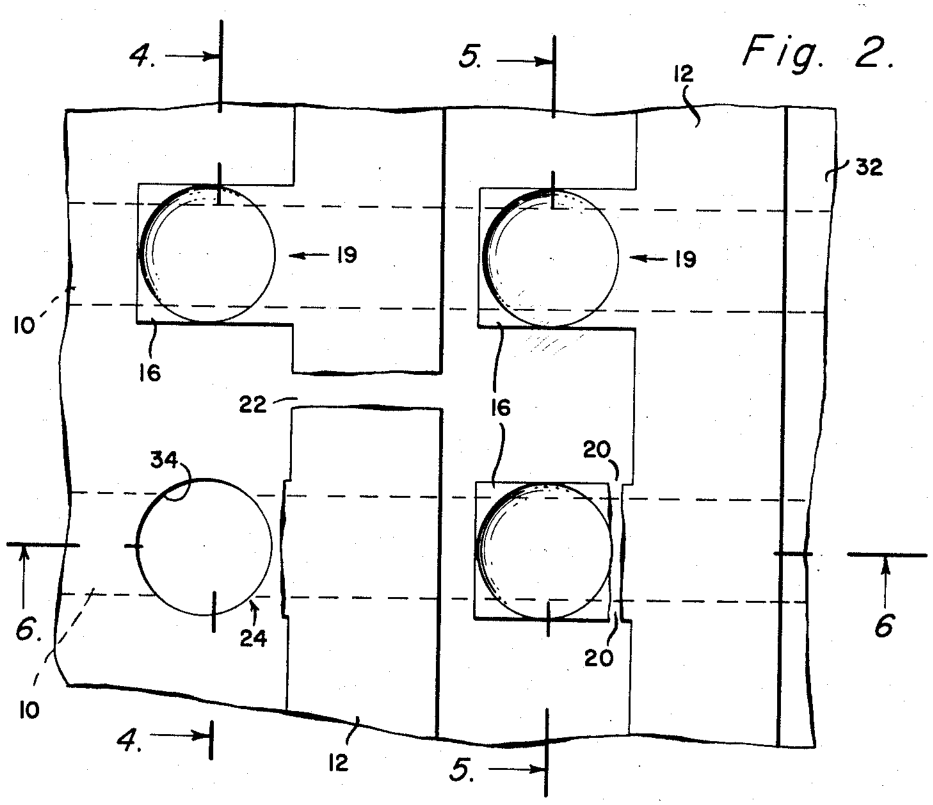
FIG. 2 is a partially schematic distorted fragmentary plan view of the apparatus of FIG. 1.
Figure 3:
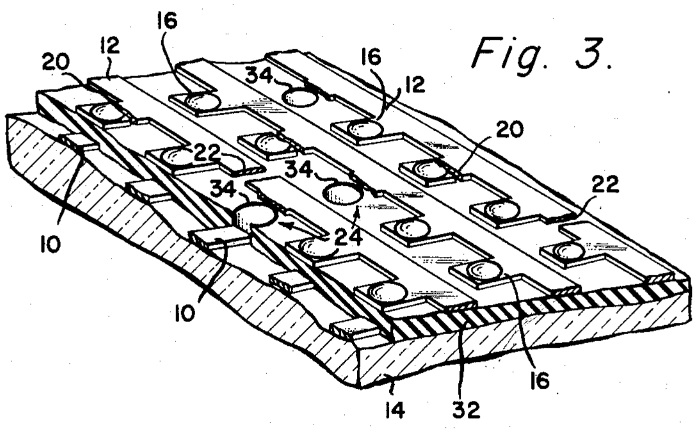
FIG. 3 is a partially schematic distorted fragmentary perspective view of the apparatus of FIG. 1 in partial cross-section.

Turning now to FIG. 1, a plurality of horizontal conducting lines or conductors 10 and vertical conducting lines 12 are shown on an insulating substrate 14. Referring to FIGS. 1–3, it may be seen that a completed interconnection grid comprises superimposed horizontal conducting lines 10 and vertical conducting lines 12, separated by insulation, and connecting portions or tabs 16, which are used to make an electrical connection between a selected horizontal and a particular vertical line.

Figure 4:
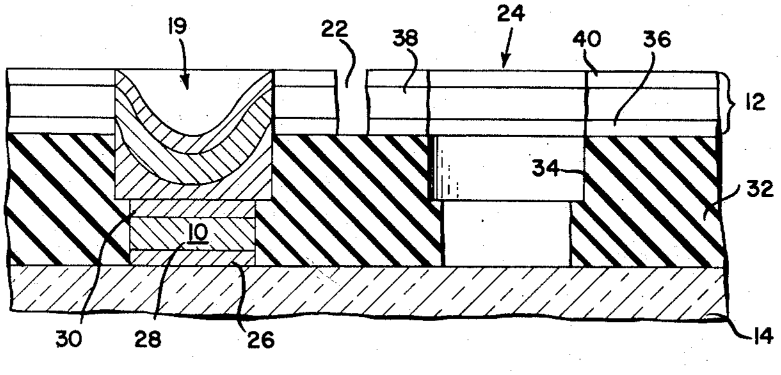
FIG. 4 is a distorted and enlarged cross-sectional view of a portion of the apparatus shown in FIG. 1 taken along the line 4—4 of FIG. 2.
Figure 5:
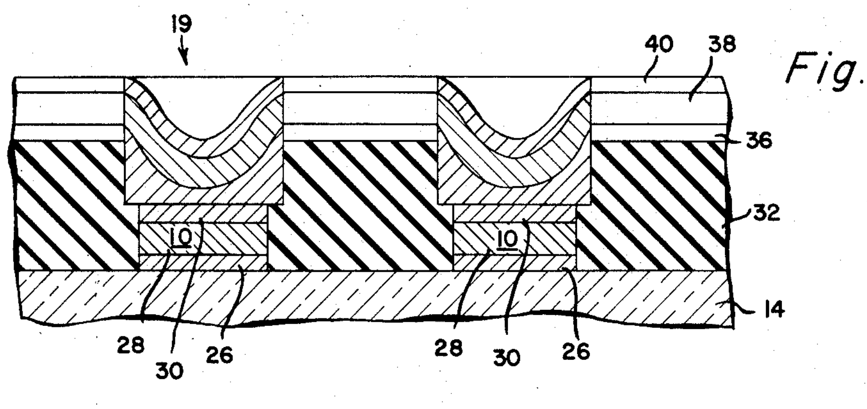
FIG. 5 is a distorted and enlarged cross-sectional view taken along the line 5—5 of FIG. 2.
Figure 6:
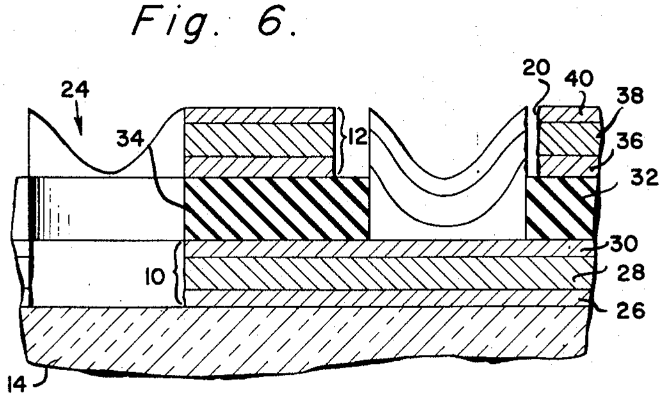
FIG. 6 is a distorted and enlarged cross-sectional view taken along the line 6—6 of FIG. 2.

As will be explained heerinafter, at an intermediate stage in the construction of the device shown in FIG. 1, each of the vertical lines 12 is furnished with a plurality of tabs 16 which connect the vertical line 12 to each horizontal line 10. Electrical continuity then exists between connecting portion 16 and a horizontal line 10, since each connecting portion 16 rests on the surface of a horizontal connecting line 10. Such connections are shown in FIGS. 2, 4 and 5, and are generally designated by the reference charter 19. If it is desired to break the electrical connection between a selected horizontal line 10 and a selected vertical line 12, a portion of the tab 16 is removed, as shown at location 20 (FIG. 2), electrically isolating the selected pair of horizontal and vertical lines. Such a break in electrical continuity is shown in FIGS. 2 and 6. If it is desired to break the electrical continuity of a vertical line, a portion of the vertical line is removed, as shown at location 22 in FIGS. 2 and 4. If it is desired to break the electrical continuity of a horizontal line, the entire tab 16 and a portion of the horizontal line is removed, as shown at location 24. FIGS. 2 and 4–6 show the details of the tab structure and the various breaks in electrical continuity which may be achieved. The various layers shown in the cross-sections (FIGS. 4–6), will be described in detail below in connection with the description of the method of manufacture of the grid.

A substrate 14 of suitable material for providing mechanical support acts as a supporting structure for the interconnecting grid and may be glass or other insulating material. The substrate is preferably cleaned with a solution typically composed of potassium dichromate and sulfuric acid, and a film of permalloy 26 having a thickness of approximately 0.5 micron is vacuum-deposited uniformly on the substrate. This thin permalloy layer is used because of its good adherence to glass and to the conducting layer which will be deposited above.

The next step is the vacuum deposition of a conducting layer 28 of approximately 10 microns thickness over the permalloy layer 26. The layer 28, which may be made of copper or other suitable electric conductor, must adhere to the permalloy layer 26 and have good conductivity. The next step is the deposition of a second film of permalloy 30 of approximately 0.5 micron thickness. This layer protects the conducting layer 28 from oxidation and provides good adherence to the insulating layer which will be deposited above.

Next, the deposited metallic layers must be formed into a plurality of parallel horizontal conducting lines. For this, a typical photographic etching process is used. Such a process is described below.

The first step is the application of a suitable photo-resist, that is, a material whose resistance to an etchant may be controlled by the selective application of light to its surface. Next, light is selectively applied to the surface of the photo-resist through a suitable mask. Photographic developer is then applied to the surface of the exposed photo-resist. A water rinse washes away the unexposed portions of the photo-resist leaving the exposed portions of the photo-resist in place. An etchant such as ferric chloride is applied to the surface of the photo-resist. The exposed portions of the photo-resist resist the action of etchants and consequently, the etchant will attack metal at the unexposed portions.

The next step is a special cleaning process which is used before each subsequent evaporative step. In the cleaning process, an epoxy solvent is first applied to the surface to remove photo-resist. Next, alcohol and sodium hydroxide are applied to remove grease and other undesired materials. A distilled water rinse is used to remove reagents and, finally, a de-ionized water rinse is used to remove all traces of reagent. It has been found that the above cleaning process effectively prepares surfaces for vacuum deposition.

The next step is the deposition of a relatively thick insulating layer 32 of a material such as silicon monoxide. This relatively thick insulating layer which may be approximately 0.001 inch high, is used to decrease electrical capacitance between horizontal and vertical conducting lines. The photographic process described above in connection with the production of horizontal lines is used again to form a pattern of roughly circular apertures in the silicon monoxide layer 32. As can be seen from FIGS. 1–3, the apertures 34 are placed upon the horizontal conducting lines adjacent each intersection with a vertical line.

The next step is the formation of the aperture pattern by the formation of holes 34 in the silicon monoxide layer 32. It has been found that a vacuum deposited silicon monoxide layer is resistant to commonly used chemical etchants such as hydrofluoric acid. In view of this, a sandblast step is used to selectively remove silicon monoxide at all intersections, forming interconnections between horizontal and vertical conducting lines. An especially thick layer of photo-resist is used since it will resist the action of the sandblast. In addition, it has been found that the relatively soft metal composing the horizontal lines also resists the sandblast. Therefore, sandblasting selectively removes the silicon monoxide from those portions of the silicon monoxide layer which were exposed to light. The action of the sandblast is arrested when a horizontal line is encountered.

The cleaning process described above is now employed. Although it might have been anticipated that some of the abrasive material used in the sandblast step would contaminate the exposed permalloy-copper strips, this has not been found to be the case, and the normal cleaning technique previously outlined has proven adequate.

The next step is the deposition of a relatively thin layer 36 of approximately 0.5 micron of permalloy over the entire surface. The reasons for the use of a permalloy layer are the same as those given above in connection with the layer 26. As before, a relatively thick conducting layer 38 of copper or other suitable conduction material is then deposited, and last, a second permalloy layer 40 similar to the layer 30, is deposited. The vertical conducting lines including the tab portions 16 are obtained by the photographic etching process described above in connection with the formation of the horizontal conducting lines.

All of the steps given above are uniform without regard to the individual interconnections desired for a particular circuit configuration. There now exists a plurality of horizontal lines, each having electrical continuity and a plurality of vertical lines, each having electrical continuity. Also, electrical connections have been made between each horizontal and each vertical line. The desired electrical interconnection configuration may be obtained by performing one of three operations at each intersection of a horizontal and vertical line. The first of these operations is the removal of the electrical connection between a horizontal and a vertical line. As has been stated above, this can be accomplished by removing a portion of a tab at a position immediately adjacent a vertical line. The second operation is the breaking of the electrical continuity of a vertical line. This can be accomplished by removing a portion of the vertical line. The third operation is the breaking of the electrical continuity of a horizontal line. This can be performed by removing the entire tab portion, and a portion of the horizontal line immediately therebelow.

A particular circuit is obtained by the use of a mask which either permits one of the three operations listed above or which prevents any operation, at each intersection of horizontal and vertical lines. The conventional photographic process described above is now used to perform the interconnection operation. A relatively thin layer of photo-resist is deposited uniformly on the surface. A mask prepared in accordance with the circuit configuration to be interconnected selectively exposes to light those portions of the surface which it is desired to etch. The photo-resist is developed and washed, and finally, suitable etchant is applied.

Thus, there is disclosed an interconnection grid and a method of manufacture thereof. As an example of the size of a grid which may be made by the above-described process, the horizontal lines may have a width of 0.005 to 0.010 inch, or with 0.010 inch spacing between lines. Even smaller lines and spacings have been achieved. The vertical lines may have approximately the same width. However, because of the use of extending tabs, the spacing between vertical lines is approximately 0.030 inch.

The electrical characteristics of the grid described above are as follows. The resistance of conducting lines is approximately 0.3 ohm per inch. The capacitance between one conducting line and the two adjacent lines is approximately $3\mu\mu$f. per inch. The capacitance between a horizontal and a vertical line measured at an intersection is approximately $0.025\mu\mu$f. per intersection.

A method of manufacture has been disclosed which, by the use of techniques which are extremely well adapted to mass production, provides an interconnection grid of relatively simple and inexpensive manufacture and which yields a general purpose grid which can be adapted to any desired circuit configuration by a single final step of manufacture.

What is claimed is:

1. An electrical interconnection grid comprising a first plurality of electrical conductors, each having electrical continuity, a second plurality of electrical conductors, each having electrical continuity and crossing said first conductors and insulated therefrom, each conductor of said second plurality of electrical conductors having a plurality of tab portions extending therefrom and making electrical contact with respective conductors of said first plurality of electrical conductors, circuits including selected portions of conductors and tab portions being obtained by severing conductors to leave said selected portions and severing tab portions from conductors excepting those tab portions forming part of said circuits.

2. An electrical interconnection grid comprising a first plurality of electrical conductors, each having electrical continuity, a second plurality of electrical conductors, each having electrical continuity and crossing said first conductors and insulated therefrom, each conductor of said second plurality of electrical conductors having a plurality of tab portions extending therefrom, each of said tab portions of respective pluralities of tab portions making electrical contact with respective ones of said first conductors, at least one of said tab portions being electrically separated from its associated second conductor.

3. An electrical interconnection grid comprising a first plurality of electrical conductors, each having electrical continuity, an insulating layer disposed over said first conductors, said insulating layer having respective pluralities of holes, respectively exposing portions of respective conductors of said first plurality of electrical conductors, a second plurality of electrical conductors, each conductor of said second plurality of electrical conductors having electrical continuity and crossing said first conductors, each conductor of said second plurality of electrical conductors having a plurality of tab portions extending therefrom and making electrical contact with respective conductors of said first plurality of electrical conductors through said holes, selected circuits being formed severing selected conductors and by severing selected tab portions from their conductors.

4. An electrical interconnection grid according to claim 1 in which each of said first plurality of electrical conductors and each of said second plurality of electrical conductors comprises a first relatively thin film of conducting material, a second superimposed relatively thick film of conducting material, and a third superimposed relatively thin film of conducting material.

5. An electrical interconnection grid according to claim 1 in which all of said electrical conductors are supported on a substrate of insulating material, and in which each of said electrical conductors comprises a first relatively thin film of conducting material having good adherence to said substrate, a second superimposed relatively thick film of conducting material having good adherence to said first film, and a third superimposed relatively thin film of conducting material having good adherence to said second film.

6. An electrical interconnection grid, comprising: a support of electrical insulating material; a first plurality of electrical conductors disposed in substantially parallel relationship upon said support; electrical insulating material disposed over said conductors and having pluralities of openings therethrough over each conductor; a second plurality of electrical conductors disposed at an angle to the conductors of said first plurality of conductors on said electrical insulating material, in substantially parallel relationship with one another, in positions displaced from said openings and each conductor of said second plurality of conductors having tabs projecting substantially laterally therefrom and extending through respective adjacent openings and electrically contacting respective conductors of said first plurality of conductors; circuits of predetermined configuration including selected portions of conductors and tabs being obtained by severing conductors to leave said selected portions and severing tabs excepting those tabs forming part of said circuits.

References Cited in the file of this patent

UNITED STATES PATENTS

| | | |
|---|---|---|
| 2,006,436 | Bowers | July 2, 1935 |
| 2,019,625 | O'Brien | Nov. 5, 1935 |
| 2,297,488 | Luderitz | Sept. 29, 1942 |
| 2,271,822 | Pritikin | Oct. 25, 1955 |
| 2,728,693 | Cado | Dec. 27, 1955 |
| 2,872,391 | Hauser et al. | Feb. 3, 1959 |
| 2,889,532 | Slack | June 2, 1959 |
| 2,952,828 | Dorizzi | Sept. 13, 1960 |
| 3,038,105 | Brownfield | June 5, 1962 |

OTHER REFERENCES

Publication I, "IBM Technical Disclosure Bulletin," vol. 2, No. 4, December 1959.